(12) United States Patent
Lin et al.

(10) Patent No.: US 12,255,589 B2
(45) Date of Patent: Mar. 18, 2025

(54) AUDIO SIGNAL MODULATION AND AMPLIFICATION CIRCUIT

(71) Applicant: REALTEK SEMICONDUCTOR CORP., Hsinchu (TW)

(72) Inventors: Che-Hung Lin, Hsinchu (TW); Chia-I Chuang, Hsinchu (TW); Yu-An Lee, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 432 days.

(21) Appl. No.: 17/877,444

(22) Filed: Jul. 29, 2022

(65) Prior Publication Data

US 2023/0198482 A1 Jun. 22, 2023

(30) Foreign Application Priority Data

Dec. 16, 2021 (TW) ................................. 110147303

(51) Int. Cl.
*H03F 3/217* (2006.01)
*H03F 1/26* (2006.01)
*H03F 3/45* (2006.01)

(52) U.S. Cl.
CPC ............. *H03F 3/2171* (2013.01); *H03F 1/26* (2013.01); *H03F 3/2178* (2013.01); *H03F 3/45071* (2013.01); *H03F 2200/03* (2013.01); *H03F 2200/165* (2013.01); *H03F 2200/351* (2013.01); *H03F 2200/78* (2013.01)

(58) Field of Classification Search
CPC ........ H03F 3/2171; H03F 1/26; H03F 3/2178; H03F 3/45071; H03F 2200/03; H03F 2200/165; H03F 2200/351; H03F 2200/78; H03F 1/523; H03F 2200/114; H03F 3/187; H03F 3/45475; H03F 3/2173
USPC ........................................ 330/10, 251, 207 A
See application file for complete search history.

(56) References Cited

U.S. PATENT DOCUMENTS

| 8,558,609 B2 * | 10/2013 | Fang ........................ H03K 7/08 330/10 |
| 10,027,294 B2 * | 7/2018 | Wang ....................... H03F 3/185 |
| 10,965,279 B2 * | 3/2021 | Ramadass ............... H03L 7/093 |
| 2007/0024365 A1 | 2/2007 | Ramaswamy et al. |

(Continued)

*Primary Examiner* — Hieu P Nguyen
(74) *Attorney, Agent, or Firm* — Birch, Stewart, Kolasch & Birch, LLP

(57) ABSTRACT

An audio signal modulation and amplification circuit includes a common-mode electric potential controller, a carrier generator, and channel circuits. The common-mode electric potential controller is configured to generate one or more first common-mode electric potentials and second common-mode electric potentials. The carrier generator is adapted to receive the first common-mode electric potential to generate a carrier signal. Each of the channel circuits includes a filter, a comparison circuit, and a driving circuit. The filter is adapted to filter an input signal and generate a filtered signal based on a corresponding one of the second common-mode electric potentials. The comparison circuit is configured to compare the potential of the carrier signal with the potential of the filtered signal to generate a pulse-width modulation signal. The driving circuit is configured to be turned on or off in response to the pulse-width modulation signal to output a load driving signal.

10 Claims, 7 Drawing Sheets

(56) References Cited

U.S. PATENT DOCUMENTS

2014/0125406 A1 5/2014 Wu et al.
2016/0344348 A1 11/2016 Yuan et al.

* cited by examiner

AUDIO SIGNAL MODULATION AND AMPLIFICATION CIRCUIT

CROSS-REFERENCE TO RELATED APPLICATION

This non-provisional application claims priority under 35 U.S.C. § 119(a) to Patent Application No. 110147303 filed in Taiwan, R.O.C. on Dec. 16, 2021, the entire contents of which are hereby incorporated by reference.

BACKGROUND

Technical Field

The instant disclosure relates to a modulation and amplification circuit, especially a modulation and amplification circuit configured to generate driving signals for audio devices.

Related Art

Currently, class D power amplifiers have gradually become the mainstream selection for audio power amplifier applications, such as mobile phones, tablet computers, televisions, and stereos. However, class D power amplifiers known to the inventor adopt digital power amplification technology, which may easily cause electromagnetic interference (EMI) at the signal edges (the rising edge or the falling edge for example) of the output stage due to the switching actions.

Specifically for class D amplifiers known to the inventor which are applied to multichannel stereos, the simultaneous switching of multiple channels may further worsen the electromagnetic interference problem.

SUMMARY

The instant disclosure provides an audio signal modulation and amplification circuit. According to some of the exemplary embodiments, the audio signal modulation and amplification circuit comprises a common-mode electric potential controller, a carrier signal generator, and a plurality of channel circuits. The common-mode electric potential controller is configured to generate at least one first common-mode electric potential and a plurality of second common-mode electric potentials. Each of the second common-mode electric potentials is not equal to one another. The carrier signal generator is adapted to receive the at least one first common-mode electric potential so as to generate a carrier signal based on the at least one first common-mode electric potential. Each of the channel circuits corresponds to a corresponding one of the second common-mode electric potentials, and each of the channel circuits comprises a filter, a comparison circuit, and a driving circuit. The filter is adapted to receive an input signal so as to filter the input signal and to generate a filtered signal based on the corresponding one of the second common-mode electric potentials. The comparison circuit is configured to compare the potential of the carrier signal with the potential of the filtered signal so as to generate a pulse-width modulation (PWM) signal. The driving circuit is configured to be turned on or off in response to the pulse-width modulation signal so as to output a load driving signal.

In some other exemplary embodiments, the common-mode electric potential controller is configured to generate a plurality of first common-mode electric potentials and a second common-mode electric potential, wherein each of the first common-mode electric potentials is not equal to one another. The carrier signal generator is adapted to receive the first common-mode electric potentials so as to generate a plurality of carrier signals based on the first common-mode electric potentials. Each of the channel circuits corresponds to a corresponding one of the carrier signals, and each of the channel circuits comprises a filter, a comparison circuit, and a driving circuit. The filter is adapted to receive an input signal so as to filter the input signal and to generate a filtered signal based on the second common-mode electric potential. The comparison circuit is configured to compare the potential of the corresponding one of the carrier signals with the potential of the filtered signal and to generate a pulse-width modulation signal. The driving circuit is configured to be turned on or off in response to the pulse-width modulation signal so as to output a load driving signal.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
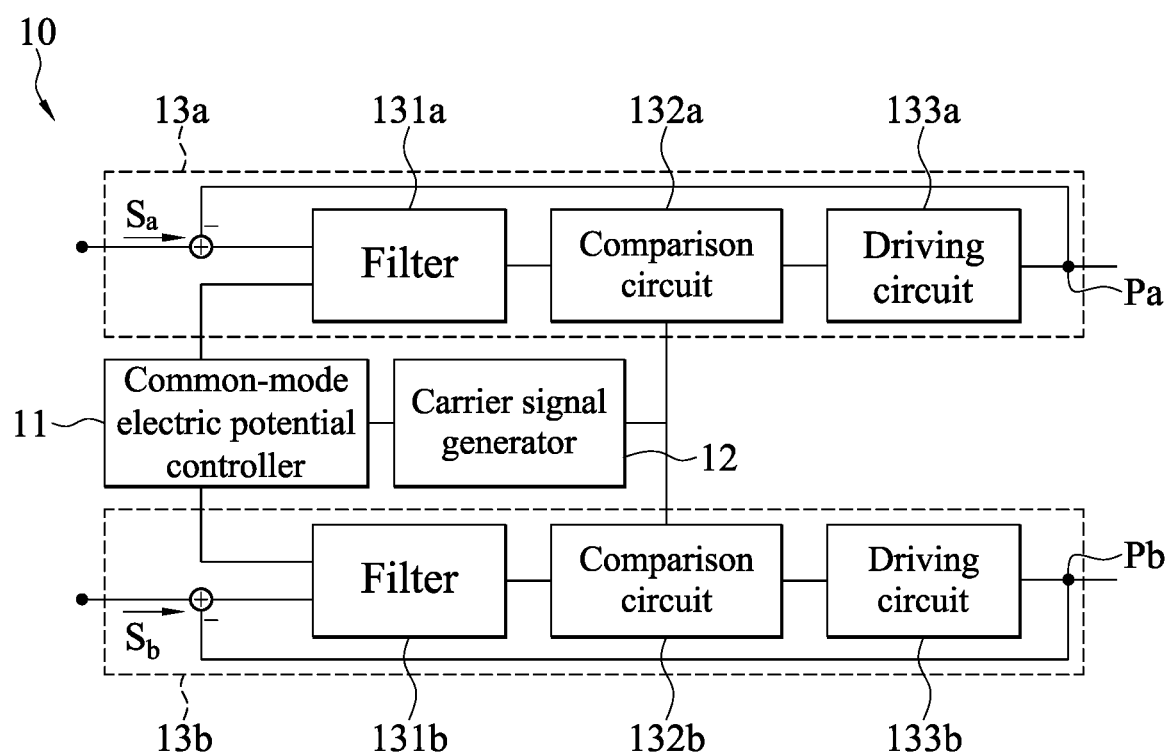
FIG. 1 illustrates a functional block diagram of an audio signal modulation and amplification circuit according to a first exemplary embodiment of the instant disclosure.

FIG. 1 illustrates a functional block diagram of an audio signal modulation and amplification circuit according to a first exemplary embodiment of the instant disclosure. Please refer to FIG. 1. The audio signal modulation and amplification circuit 10 is adapted for devices with audio functions, such as mobile phones, tablet computers, televisions, and stereos, to drive at least one load, such as a speaker.

In the first exemplary embodiment, the audio signal modulation and amplification circuit 10 comprises a common-mode electric potential controller 11, a carrier signal generator 12, and a plurality of channel circuits 13a, 13b. The channel circuit 13a comprises a filter 131a, a comparison circuit 132a, and a driving circuit 133a. The channel circuit 13b comprises a filter 131b, a comparison circuit 132b, and a driving circuit 133b. The common-mode electric potential controller 11 is signally coupled to the carrier signal generator 12 and each of the channel circuits 13a, 13b. The carrier signal generator 12 is signally coupled to the comparison circuits 132a, 132b of the channel circuits 13a, 13b. The filters 131a, 131b of the channel circuits 13a, 13b are signally coupled to the comparison circuits 132a, 132b, respectively. That is, in this embodiment, the filter 131a is signally coupled to the comparison circuit 132a, and the filter 131b is signally coupled to the comparison circuit 132b. The comparison circuits 132a, 132b are signally coupled to the driving circuits 133a, 133b, respectively. That is, in this embodiment, the comparison circuit 132a is signally coupled to the driving circuit 133a, and the comparison circuit 132b is signally coupled to the driving circuit 133b.

The common-mode electric potential controller 11 is configured to generate multiple common-mode electric potentials with different potentials at identical time points. The common-mode electric potentials are not limited to DC or AC signals. For example, the common-mode electric potential controller 11 may comprise at least one selected from the group consisting of a rectifier and a regulator to generate DC potentials. Alternatively, in one embodiment, the common-mode electric potential controller 11 may also comprise at least one selected from the group consisting of a transistor-based circuit or a diode-based circuit, which may be, but not limited to, an amplifier, a damper, or a voltage doubler to regulate the common-mode electric potentials. On the other hand, the common-mode electric potential controller 11 may also comprise an oscillation circuit, which may be, but not limited to, a feedback operational amplifier, an RC oscillator, or a crystal oscillator to generate AC potentials. Each of the common-mode potentials may be the component of a single signal or may be the common-mode components of two differential signals.

The carrier signal generator 12 is configured to generate carrier signals. The carrier signals are periodic AC signals, which may be, but not limited to, triangular waves, sawtooth waves, sinusoidal waves, or square waves. In an exemplary embodiment, an oscillation circuit of the carrier signal generator 12 generates a periodic signal, and then, based on the first common-mode electric potentials $V_{CM\_carrier}$, the oscillation circuit generates multiple in-phase carrier signals. In an exemplary embodiment, with the consideration of the 20 kHz limitation of human hearing, the oscillation frequencies of the carrier signals are set above 250 kHz. The carrier signal generator 12 receives the common-mode electric potential generated by the common-mode electric potential controller 11 so as to generate the carrier signals based on the common-mode electric potential. For example, the common-mode electric potential controller 11 generates a 3V DC potential, and based on the 3V DC potential, the carrier signal generator 12 generates a triangular wave carrier signal whose peak voltage is 5 V, valley voltage is 1 V, and amplitude is 2 V. The carrier signal generator 12 is capable of generating a single carrier signal or multiple carrier signals with different potentials at identical time points. In the first exemplary embodiment, the carrier signal generator 12 outputs carrier signals with identical potentials to the channel circuits 13a, 13b.

The channel circuits 13a, 13b may be integrated circuits (ICs) or single chips respectively integrating the filters 131a, 131b, the comparison circuits 132a, 132b, and the driving circuits 133a, 133b. The audio signal modulation and amplification circuit 10 comprises multiple channel circuits 13a, 13b, and the channel circuits 13a, 13b may correspond to an identical common-mode electric potential generated by the common-mode electric potential controller 11, or the channel circuits 13a, 13b may respectively correspond to different common-mode electric potentials generated by the common-mode electric potential controller 11. For example, the common-mode electric potential controller 11 respectively generates two DC common-mode electric potentials with 2V and 3V amplitudes; the DC common-mode electric potential with 2V amplitude is provided for the loop filter 131a of the channel circuit 13a, and the DC common-mode electric potential with 3V amplitude is provided for the loop filter 131b of the channel circuit 13b.

The filters 131a, 131b are adapted to receive and filter input signals $S_a$, $S_b$, respectively. Besides, the potentials of the output signals of the filters 131a, 131b are modulated by the common-mode electric potentials generated by the common-mode electric potential controller 11. The bandwidths of the filters 131a, 131b may be adjusted upon requirements; for example, the bandwidths of the filters 131a, 131b may adopt the auditory range of the auditory device which adopts the audio signal modulation and amplification circuit 10. In an exemplary embodiment, the filters 131a, 131b adopt loop filters to negatively feedback signals from the output points Pa, Pb to the inputs of the driving circuits 133a, 133b, respectively, so as to provide loop gains. In an exemplary embodiment, each of the channel circuits 13a, 13b receives the same input signal ($S_a$ or $S_b$). In an exemplary embodiment, the input signals $S_a$, $S_b$ may be filtered in advance. Then, the filters 131a, 131b of the channel circuits 13a, 13b receive the filtered input signals $S_a$, $S_b$, respectively, and adjust the potentials of the input signals $S_a$, $S_b$ based on the common-mode electric potential(s) generated by the common-mode electric potential controller 11, and the bandwidths of the filters 131a, 131b cover the frequency ranges of the input signals $S_a$, $S_b$, respectively.

The filters 131a, 131b output the filtered signals to the comparison circuits 132a, 132b, respectively, and then the comparison circuits 132a, 132b compare the potentials of the carrier signals with the potentials of the filtered signals to generate pulse-width modulation (PWM) signals. In detail, in an exemplary embodiment, when the potential of the filtered signal is higher than the potential of the carrier signal, the comparison circuit outputs a logical high; on the contrary, when the potential of the filtered signal is lower than the potential of the carrier signal, the comparison circuit outputs a logical low.

The driving circuits 133a, 133b are turned on or off in response to the pulse-width modulation signals to output load driving signals so as to drive the load. The driving circuits 133a, 133b may each comprise one or multiple transistor-based switching circuits, such as push-pull amplifiers or totem pole amplifiers. The switching circuit may adopt half-bridge (HB) configuration, or the switching circuit may adopt full-bridge (FB) configuration for differential-mode pulse-width modulation driving. To cope with the matching problem due to forestage current output capability, in an exemplary embodiment, the pulse-width modulation signals modulate the gate driving circuits of the driving circuits 133a, 133b to drive the switching circuits. In an exemplary embodiment, the driving circuits 133a, 133b may comprise demodulation circuits; for example, RC filters can be adopted to demodulate the pulse-width modulation signals, alternatively, in another example, LC filters can be adopted for reducing the power loss of the demodulation. In the following paragraphs, a single-channel circuit will be used as the example for elaboration.

Figure 2:
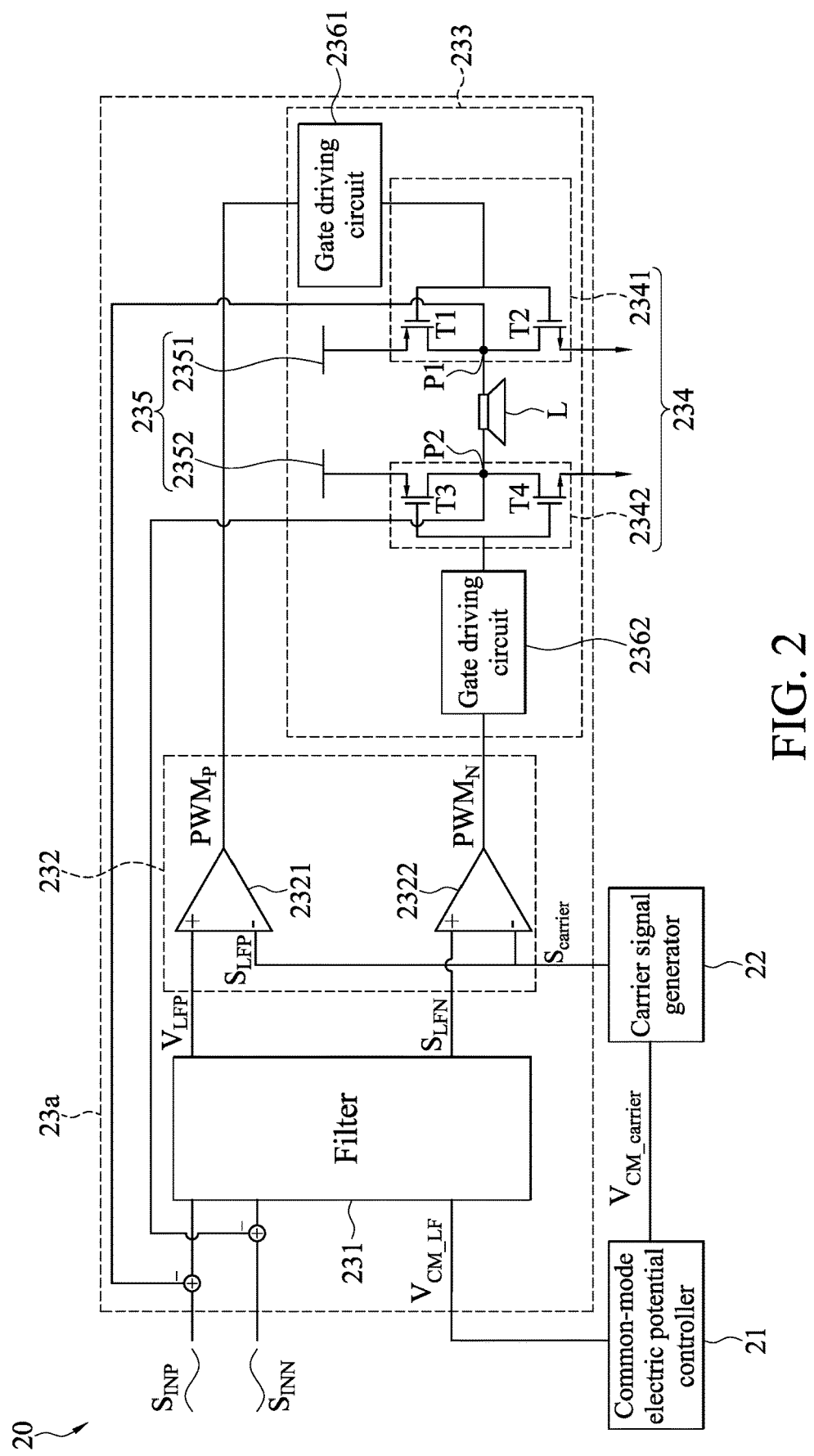
FIG. 2 illustrates a schematic diagram of an audio signal modulation and amplification circuit according to a second exemplary embodiment of the instant disclosure.

FIG. 2 illustrates a schematic diagram of an audio signal modulation and amplification circuit according to a second exemplary embodiment of the instant disclosure. Please refer to FIG. 2. In the second exemplary embodiment, for illustrative purposes, the input signals $S_{INP}$, $S_{INN}$ are described as a pair of differential signals. A common-mode electric potential controller 21 of an audio signal modulation and amplification circuit 20 generates a first common-mode electric potential $V_{CM\_carrier}$ to a carrier signal generator 22, and the common-mode electric potential controller 21 generates multiple second common-mode electric potentials $V_{CM\_LF}$ to a filter 231 of each of the channel circuits (FIG. 2 only exemplarily shows one channel circuit 23a for illustrative purposes). It should be noted that, according to different embodiments, the first common-mode electric potential $V_{CM\_carrier}$ or the second common-mode electric potential $V_{CM\_LF}$ may be a single signal or multiple signals, respectively. The first common-mode electric potential $V_{CM\_carrier}$ and the second common-mode electric potential $V_{CM\_LF}$ may be equal or unequal. The input signals $S_{INP}$, $S_{INN}$ are inputted into the filter 231, and then the filter 231 outputs filtered signals $S_{LFP}$, $S_{LFN}$. A comparison circuit 232 may comprise a first comparator 2321 and a second comparator 2322. The first comparator 2321 receives the filtered signal $S_{LFP}$ and the carrier signal $S_{carrier}$ to generate a pulse-width modulation signal $PWM_P$. The second comparator 2322 receives the antiphase filtered signal $S_{LFN}$ and the carrier signal $S_{carrier}$ to generate another pulse-width modulation signal $PWM_N$.

Figure 3A:
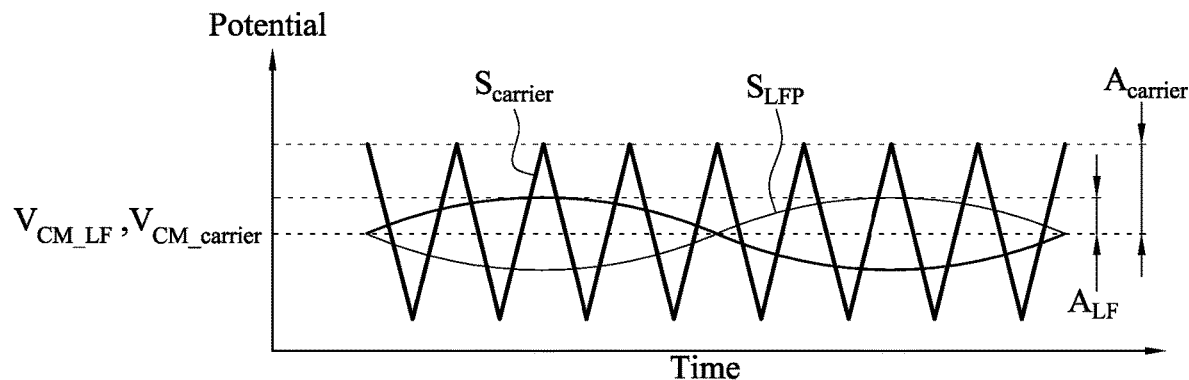
FIG. 3A and FIG. 3B illustrate schematic diagrams of carrier signals and filtered signals according to some exemplary embodiments of the instant disclosure.
Figure 3B:
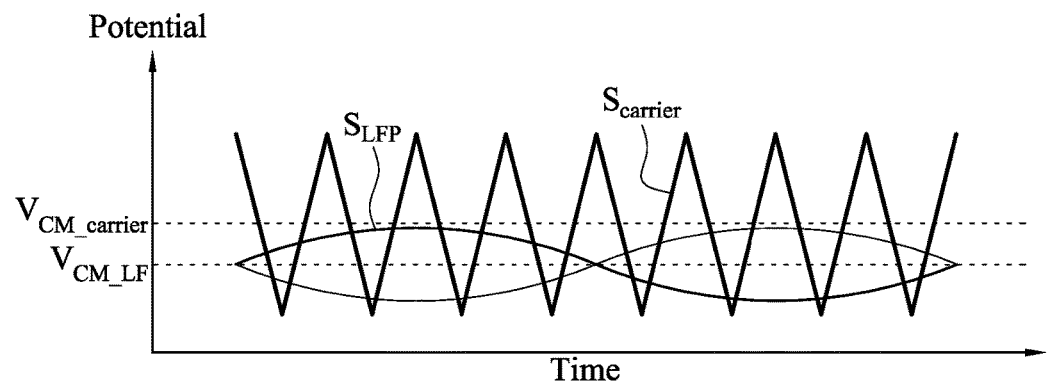
Figure 3C:
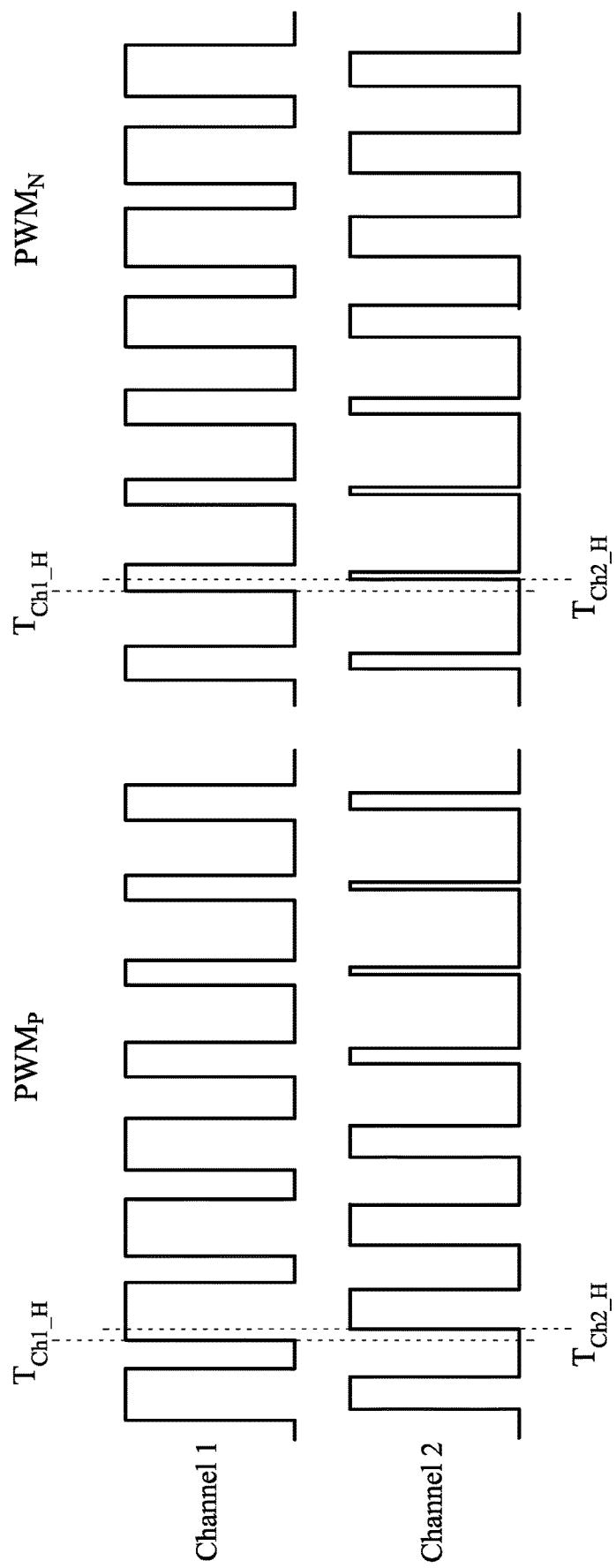
FIG. 3C illustrates a schematic diagram of pulse-width modulation (PWM) signals according to some exemplary embodiments of the instant disclosure.

FIG. 3A and FIG. 3B illustrate schematic diagrams of carrier signals and filtered signals according to some exemplary embodiments of the instant disclosure; FIG. 3C illustrates the schematic diagram of pulse-width modulation signals according to some exemplary embodiments of the instant disclosure. Please refer to FIG. 3A and the pulse-width modulation waveform of the channel 1 in the upper half portion of FIG. 3C. When the comparison circuit 232 determines that the potential of the filtered signal $S_{LFP}$ is higher than the potential of the carrier signal $S_{carrier}$, the comparison circuit 232 outputs a logical high. The waveform of the filtered signal $S_{LFP}$ shown in FIG. 3A is changed from a positive half cycle of a sinusoidal wave to a negative half cycle of the sinusoidal wave. During most periods of the positive half cycle, the potential of the filtered signal $S_{LFP}$ is higher than the potential of the carrier signal $S_{carrier}$; during most periods of the negative half cycle, the potential of the filtered signal $S_{LFP}$ is lower than the potential of the carrier signal $S_{carrier}$. Accordingly, the pulse width of the pulse-width modulation signal $PWM_P$ of channel 1 shown in FIG. 3C is changed from wide to narrow. On the contrary, the waveform of the filtered signal $S_{LFN}$ shown in FIG. 3A is changed from the negative half cycle of a sinusoidal wave to the positive half cycle of the sinusoidal wave, and thus the pulse width of the pulse-width modulation signal $PWM_N$ of channel 1 shown in FIG. 3C is changed from narrow to wide. In other words, the duty ratio of the pulse-width modulation signals $PWM_P$, $PWM_N$ are modulated by the differences between the potentials of the filtered signals $S_{LFP}$, $S_{LFN}$ and the potential of the carrier signal $S_{carrier}$.

A driving circuit 233 comprises a power source 235, a switching circuit 234, and a gate driving circuit. In the second exemplary embodiment, the switching circuit 234 comprises a full bridge configuration formed by a first switching circuit 2341 and a second switching circuit 2342. The first switching circuit 2341 and the second switching circuit 2342 may be coupled to the same power source 235 or respectively coupled to two independent power sources 2351, 2352. The first switching circuit 2341 comprises a P-channel field-effect transistor (FET) T1 and an N-channel field-effect transistor T2, and the second switching circuit 2342 comprises a P-channel field-effect transistor T3 and an N-channel field-effect transistor T4. The drains of the field-effect transistors T1, T2 are coupled together, and the drains of the field-effect transistors T3, T4 are coupled together.

The first comparator 2321 outputs the pulse-width modulation signal $PWM_P$ to a first date driving circuit 2361, and the first gate driving circuit 2361 is coupled to the gates of the field-effect transistors T1, T2. The second comparator 2322 outputs the pulse-width modulation signal $PWM_N$ to a second gate driving circuit 2362, and the second gate driving circuit 2362 is coupled to the gates of the field-effect transistors T3, T4. An output point P1 is formed at the coupling points (the drains) of the field-effect transistors T1, T2 of the first switching circuit 2341, and another output point P2 is formed at the coupling points (the drains) of the field-effect transistors T3, T4 of the second switching circuit 2342. A load L is bridged between the output points P1, P2. In this embodiment, when the pulse-width modulation signal $PWM_P$ is at a higher potential, and the pulse-width modulation signal $PWM_N$ is at a lower potential, the current travels from the power source 2352 to the source of the field-effect transistor T3, the output point P2, the load L, the output point P1, and finally the source of the field-effect transistor T2; when the pulse-width modulation signal $PWM_P$ is at a lower potential, and the pulse-width modulation signal $PWM_N$ is at a higher potential, the current travels from the power source 2351 to the source of the field-effect transistor T1, the output point P1, the load L, the output point P2, and finally the source of the field-effect transistor T4. In the second exemplary embodiment, a signal at the output point P1 is negatively fed back to the positive input of the filter 231, and a signal at the output point P2 is negatively fed back to the negative input of the filter 231, so that loop filtering can be achieved.

Please refer to both FIG. 3A and FIG. 3B. In this exemplary embodiment, the common-mode electric potential controller 21 generates a first common-mode electric potential $V_{CM\_carrier}$ and multiple second common-mode electric potentials $V_{CM\_LF}$, where the second common-mode electric potential $V_{CM\_LF}$ shown in FIG. 3A is higher than the second common-mode electric potential $V_{CM\_LF}$ shown in FIG. 3B. The second common-mode electric potential $V_{CM\_LF}$ shown in FIG. 3A is inputted into the channel circuit of the channel 1, and the second common-mode electric potential $V_{CM\_LF}$ shown in FIG. 3B is inputted into the channel circuit of the channel 2. Because the second common-mode electric potential $V_{CM\_LF}$ shown in FIG. 3B is lower than the second common-mode electric potential $V_{CM\_LF}$ shown in FIG. 3A, the duration when the potential of the filtered signal $S_{LFP}$ (generated based on the second common-mode electric potential $V_{CM\_LF}$) is higher than the potential of the carrier signal $S_{carrier}$ (generated based on the first common-mode electric potential $V_{CM\_carrier}$) is shortened. As a result, the duty ratios of the pulse-width modulation signals $PWN_P$, $PWM_N$ in the channel 2 are less than the duty ratios of the pulse-width modulation signals $PWN_P$, $PWM_N$ in the channel 1. Besides, the signal edges of the pulse-width modulation signals $PWM_P$, $PWM_N$ in the channel 1 and the channel 2 are not synchronized. Taking FIG. 3C as an example, a time difference exists between the trigger time $T_{Ch1\_H}$ of the rising edge in the channel 1 and the trigger time $T_{Ch2\_H}$ in the channel 2. As a result, a while after the switching circuit 234 of the channel 1 is turned on, the switching circuit 234 of the channel 2 is then turned on. Relatively, a while after the switching circuit 234 of the channel 2 is turned off, the switching circuit 234 of the channel 1 is then turned off. In this embodiment, the switching time of the switching circuit 234 of one channel does not overlap with the switching time of another channel, and thus electromagnetic interference (EMI) due to simultaneous switching is avoided.

Figure 4:
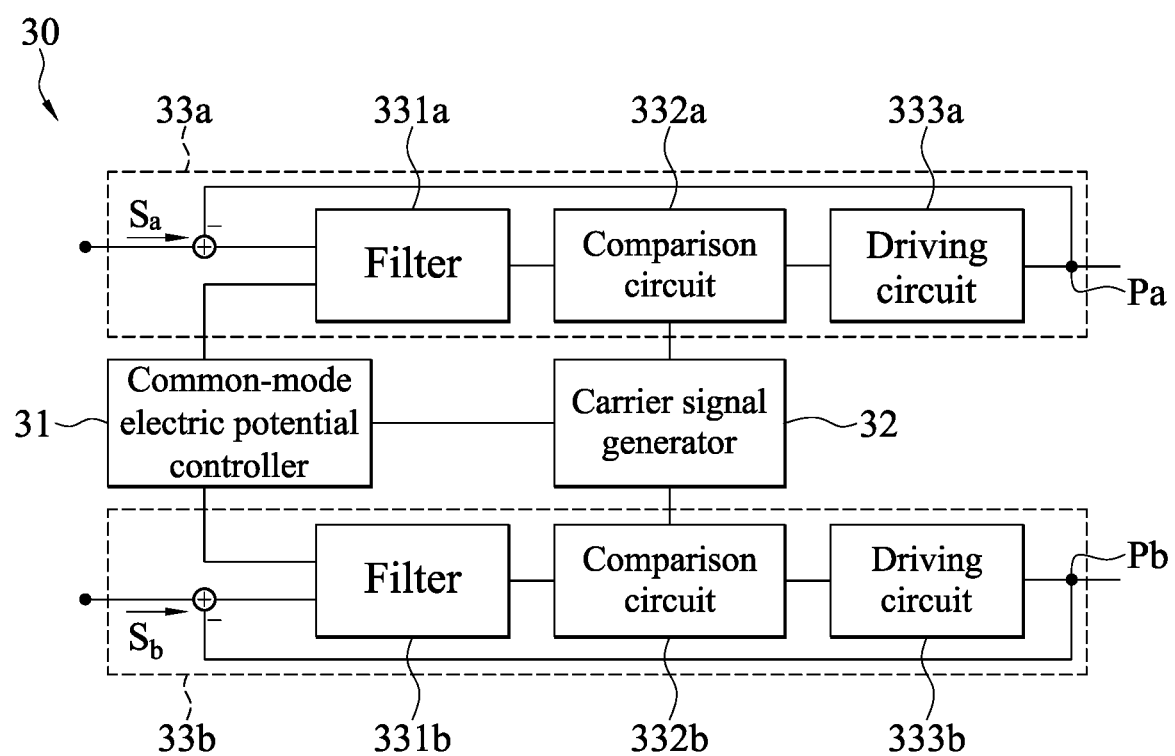
FIG. 4 illustrates a functional block diagram of an audio signal modulation and amplification circuit according to a third exemplary embodiment of the instant disclosure.

FIG. 4 illustrates a functional block diagram of an audio signal modulation and amplification circuit according to a third exemplary embodiment of the instant disclosure. Please refer to FIG. 4. In the third exemplary embodiment, the audio signal moderation and amplification circuit 30 comprises a common-mode electric potential controller 31, a carrier signal generator 32, and multiple channel circuits 33a, 33b. The channel circuit 33a comprises a filter 331a, a comparison circuit 332a, and a driving circuit 333a. The channel circuit 33b comprises a filter 331b, a comparison circuit 332b, and a driving circuit 333b. The common-mode electric potential controller 31 is signally coupled to the carrier signal generator 32 and each of the channel circuits 33a, 33b. The carrier signal generator 32 is signally coupled to the comparison circuits 332a, 332b of the channel circuits 33a, 33b. The filters 331a, 331b of the channel circuits 33a, 33b are signally coupled to the comparison circuits 332a, 332b, respectively. That is, in this embodiment, the filter 331a is signally coupled to the comparison circuit 332a, and the filter 331b is signally coupled to the comparison circuit 332b. The comparison circuits 332a, 332b are signally coupled to the driving circuits 333a, 333b, respectively. That is, in this embodiment, the comparison circuit 332a is signally coupled to the driving circuit 333a, and the comparison circuit 332b is signally coupled to the driving circuit 333b. In the third exemplary embodiment, the common-mode electric potential controller 31 outputs multiple first common-mode electric potentials $V_{CM\_carrier}$ to the carrier signal generator 32. Then, the common-mode electric potential controller 31 may generate one second common-mode electric potential $V_{CM\_LF}$ to the filters 331a, 331b of the channel circuits 33a, 33b, or the common-mode electric potential controller 31 may respectively generate multiple second common-mode electric potentials $V_{CM\_LF}$ to the filters 331a, 331b of the channel circuits 33a, 33b. The carrier signal generator 32 outputs multiple carrier signals $S_{carrier}$ with different potentials to the channel circuits 33a, 33b, respectively.

Figure 5A:
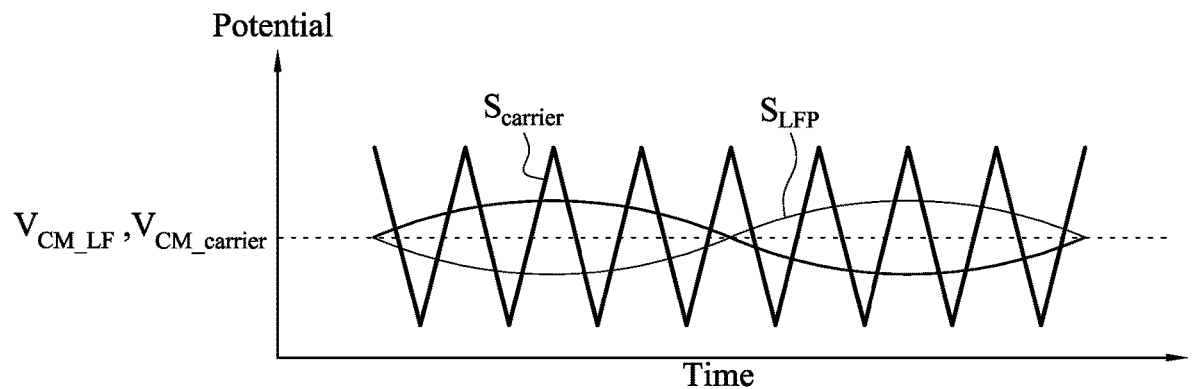
FIG. 5A and FIG. 5B illustrate schematic diagrams of carrier signals and filtered signals according to some other exemplary embodiments of the instant disclosure.
Figure 5B:
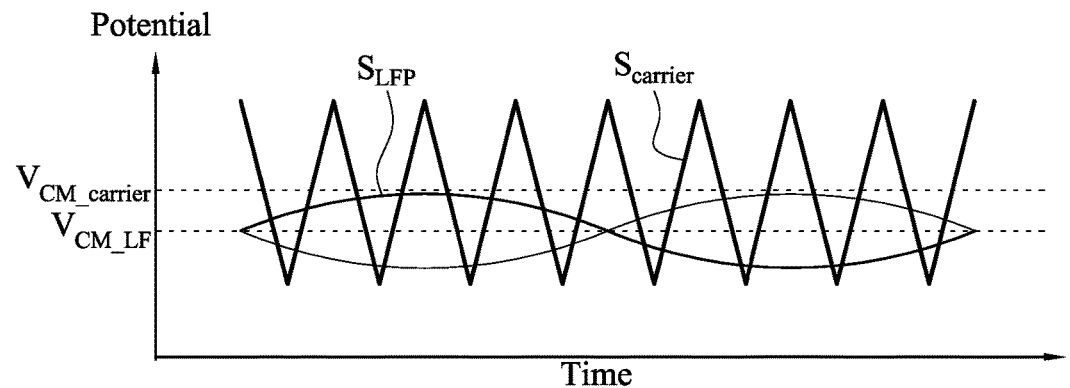
Figure 5C:
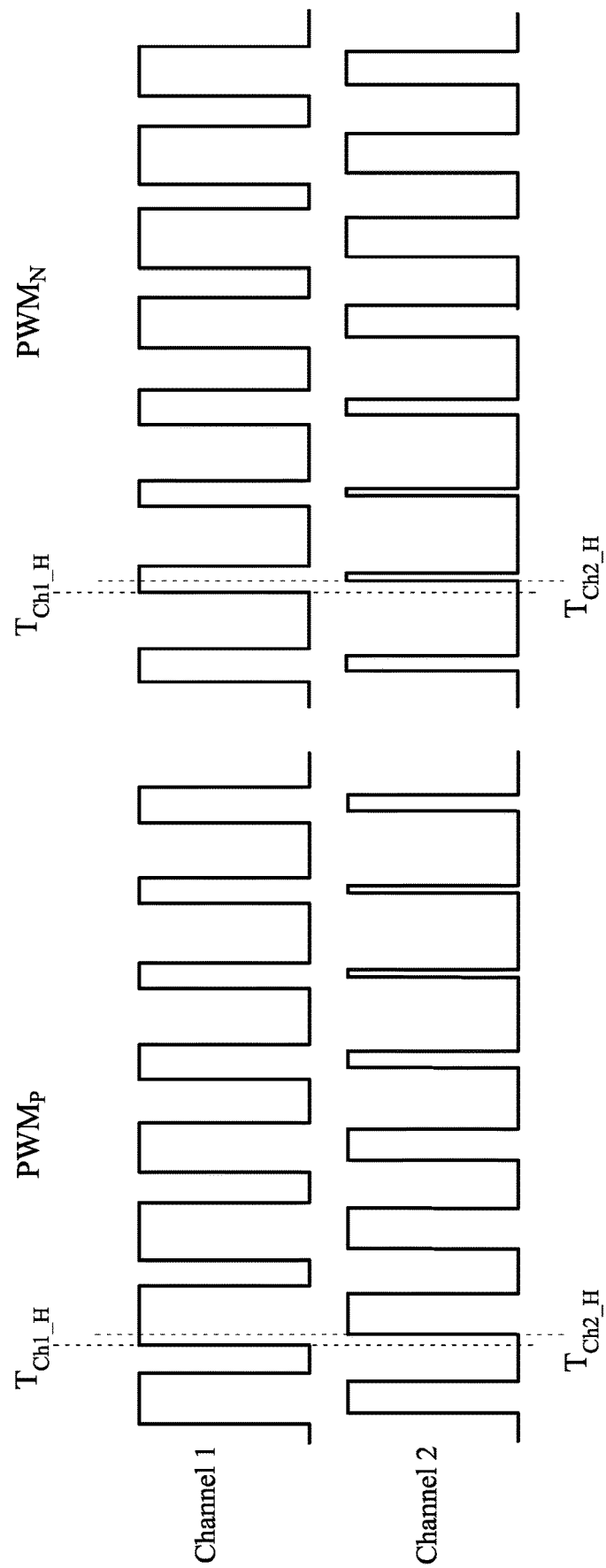
FIG. 5C illustrates a schematic diagram of pulse-width modulation signals according to some other exemplary embodiments of the instant disclosure.

FIG. 5A and FIG. 5B illustrate the schematic diagrams of carrier signals and filtered signals according to some other exemplary embodiments of the instant disclosure. Please refer to both FIG. 5A and FIG. 5B. In this exemplary embodiment, the common-mode electric potential controller 31 generates multiple first common-mode electric potentials $V_{CM\_carrier}$ and a second common-mode electric potential $V_{CM\_LF}$, where the first common-mode electric potential $V_{CM\_carrier}$ shown in FIG. 5B is higher than the first common-mode electric potential $V_{CM\_carrier}$ shown in FIG. 5A. The first common-mode electric potential $V_{CM\_carrier}$ shown in FIG. 5A is inputted into the carrier signal generator 32, and then the carrier signal generator 32 generates a first carrier signal $S_{carrier}$ to the channel circuit of the channel 1. The first common-mode electric potential $V_{CM\_carrier}$ shown in FIG. 5B is inputted into the carrier signal generator 32, and then the carrier signal generator 32 generates a second carrier signal $S_{carrier}$ to the channel circuit of the channel 2. Because the first common-mode electric potential $V_{CM\_carrier}$ shown in FIG. 5B is higher than the first common-mode electric potential $V_{CM\_carrier}$ shown in FIG. 5A, the duration when the potential of the filtered signal $S_{LFP}$ (generated based on the second common-mode electric potential $V_{CM\_LF}$) is higher than the potential of the carrier signal $S_{carrier}$ (generated based on the first common-mode electric potential $V_{CM\_carrier}$) is shortened. As a result, as shown in FIG. 5C, the duty ratios of the pulse-width modulation signals $PWN_P$, $PWM_N$ in the channel 2 are less than the duty ratios of the pulse-width modulation signals $PWN_P$, $PWM_N$ in the channel 1. Besides, the signal edges of the pulse-width modulation signals $PWM_P$, $PWM_N$ in the channel 1 and the channel 2 are not synchronized.

Please refer back to FIG. 3A and FIG. 3B. The amplitude of the filtered signal $S_{LFP}$ (generated based on the second common-mode electric potential $V_{CM\_LF}$) is lower than the amplitude of the carrier signal $S_{carrier}$ (generated based on the first common-mode electric potential $V_{CM\_carrier}$). When the potential difference between the first common-mode electric potential $V_{CM\_carrier}$ and the second common-mode electric potential $V_{CM\_LF}$ increases, the peak (valley) value of the filtered signal $S_{LFP}$ will gradually approach the peak (valley) value of the carrier signal $S_{carrier}$. When the peak (valley) value of the filtered signal $S_{LFP}$ is higher (lower) than the peak (valley) value of the filtered signal $S_{LFP}$, signal distortion will happen. Accordingly, in one exemplary embodiment, the common-mode electric potential controller 21 limits the difference between the absolute value of the second common-mode electric potential $V_{CM\_LF}$ and the absolute value of the first common-mode electric potential $V_{CM\_carrier}$ to be less than the difference between the carrier signal amplitude $A_{carrier}$ (the amplitude of the carrier signal $S_{carrier}$) and the filtered signal amplitude $A_{LF}$ (the amplitude of the filtered signal $S_{LFP}$, $S_{LFN}$). The abovementioned filtered signal amplitude $A_{LF}$ may refer to the maximum amplitude of a periodical or non-periodical signal. The abovementioned maximum amplitude may be defined based on the actual or rated output range of the filter 231; alternatively, in one embodiment, the abovementioned maximum amplitude may be defined based on the actual or rated input range of the audio signal modulation and amplification circuit 20. For example, the filtered signal $S_{LFP}$ is a sinusoidal wave with 1V amplitude, and the carrier signal $S_{carrier}$ is a triangular wave with 3V amplitude. The common-mode electric potential controller 21 generates a first common-mode electric potential $V_{CM\_carrier}$ with a DC form and 0V amplitude. In this example, the common-mode electric potential controller 21 is capable of generating multiple second common-mode electric potentials $V_{CM\_LF}$ with potentials in the range of ±2V. Alternatively, in one embodiment, the common-mode electric potential controller 21 generates two first common-mode electric potentials $V_{CM\_carrier}$ with a DC form and with 0V and 2V amplitudes, respectively. Based on the two first common-mode electric potentials $V_{CM\_carrier}$, the carrier signal generator 22 generates a first carrier signal $S_{carrier}$ and a second carrier signal $S_{carrier}$ to the first channel circuit and the second channel circuit, respectively. Therefore, in this example, the common-mode electric potential controller 21 is capable of generating multiple second common-mode electric potentials $V_{CM\_LF}$ with potentials in the range of ±2V to the first channel circuit and multiple second common-mode electric potentials $V_{CM\_LF}$ with potentials in the range between 0 and 4V to the second channel circuit.

In an exemplary embodiment, the common-mode electric potential controller 31 generates two or more first common-mode electric potentials $V_{CM\_carrier}$ (or second common-mode electric potentials $V_{CM\_LF}$). The difference between the absolute values of any two of the second common-mode electric potentials $V_{CM\_LF}$ (or the first common-mode electric potentials $V_{CM\_carrier}$) is larger than or equal to 10 mV. As a result, a minimum difference exists among the multiple common-mode electric potentials generated by the common-mode electric potential controller 31, and thus the time differences between the signal edges of the pulse-width modulation signals in the channel circuits 33a, 33b are at least 10 ns. As a result, a delay of at least one potential rise time exists between each switching of the switching circuits in each of the channels, and thus the electromagnetic interference problem is reduced. In another exemplary embodiment, considering that a minimum difference exists among the multiple common-mode electric potentials, one of the first common-mode electric potentials $V_{CM\_carrier}$ (or second common-mode electric potentials $V_{CM\_LF}$) is equal to the second common-mode electric potential $V_{CM\_LF}$ (or the first common-mode electric potential $V_{CM\_carrier}$), making the signal range of the carrier signal $S_{carrier}$ able to cover the most number of filtered signals.

To summarize the above, in an exemplary embodiment, when the input signals of the channel circuits are identical, the common-mode electric potential controller will generate multiple common-mode electric potentials, making the potentials of the filtered signals generated by the filters in the channel circuits different or making the potentials of the carrier signals received by the channel circuits different. Through this process, the comparison circuits in the channel circuits generate out-of-sync pulse-width modulation signals based on the filtered signals and carrier signals with different potentials, and thus the electromagnetic interference problem is reduced. Furthermore, because the errors generated by the adjustment of the common-mode electric potentials are common-mode errors, in differential signaling mode, the differential signals in each of the channel circuits remain unaffected, thus keeping the spectrum of the outputted differential signal of each channel circuit consistent, and the common-mode errors are not corrected by the loop filter.

Although the instant disclosure includes the above exemplary embodiments, the exemplary embodiments are not intended for the limitation of the instant disclosure. Any person having ordinary skill in the art may be capable of modification or retouch within the spirit and scope of the instant disclosure. As a result, the protected items of this instant disclosure will be defined in detail in the following claims.

What is claimed is:

1. An audio signal modulation and amplification circuit comprising:
   a common-mode electric potential controller configured to generate at least one first common-mode electric potential and a plurality of second common-mode electric potentials, wherein each of the second common-mode electric potentials is not equal to one another;
   a carrier signal generator adapted to receive the at least one first common-mode electric potential so as to generate a carrier signal based on the at least one first common-mode electric potential; and
   a plurality of channel circuits, wherein each of the channel circuits corresponds to a corresponding one of the second common-mode electric potentials, and each of the channel circuits comprises:
      a filter adapted to receive an input signal so as to filter the input signal and to generate a filtered signal based on the corresponding one of the second common-mode electric potentials;
      a comparison circuit configured to compare the potential of the carrier signal with the potential of the filtered signal so as to generate a pulse-width modulation (PWM) signal; and
      a driving circuit configured to be turned on or off in response to the pulse-width modulation signal so as to output a load driving signal.

2. The audio signal modulation and amplification circuit according to claim 1, wherein for each of the channel circuits, the difference between the absolute value of the first common-mode electric potential and the absolute value of the corresponding one of the second common-mode electric potentials is less than the difference between the amplitude of the carrier signal and the maximum amplitude of the filtered signal.

3. The audio signal modulation and amplification circuit according to claim 2, wherein one of the second common-mode electric potentials is equal to the at least one first common-mode electric potential.

4. The audio signal modulation and amplification circuit according to claim 1, wherein the difference between the absolute values of any two of the second common-mode electric potentials is greater than or equal to 10 mV.

5. The audio signal modulation and amplification circuit according to claim 1, wherein the driving circuit comprises a power source, a gate driving circuit, and a switching circuit; the power source is coupled to the switching circuit, the switching circuit comprises two field-effect transistors (FETs), the comparison circuit is coupled to the gate driving circuit, the gate driving circuit is coupled to gates of the two field-effect transistors, and the two field-effect transistors are connected in series to form an output point to output the load driving signal.

6. The audio signal modulation and amplification circuit according to claim 5, wherein the comparison circuit comprises a first comparator and a second comparator, the driving circuit comprises a first switching circuit and a second switching circuit; the filter generates a first filtered signal and a second filtered signal, the first filtered signal and the second filtered signal are in antiphase and are respectively outputted to the first comparator and the second comparator; the first comparator is coupled to the first switching circuit, the second comparator is coupled to the second switching circuit, and the output point of the first switching circuit and the output point of the second switching circuit are adapted to bridge a load.

7. The audio signal modulation and amplification circuit according to claim 5, wherein the filter is a loop filter, and the output point formed by the two field-effect transistors is coupled to the input end of the loop filter.

8. An audio signal modulation and amplification circuit comprising:
   a common-mode electric potential controller configured to generate a plurality of first common-mode electric potentials and a second common-mode electric potential, wherein each of the first common-mode electric potentials is not equal to one another;
   a carrier signal generator adapted to receive the first common-mode electric potentials so as to generate a plurality of carrier signals based on the first common-mode electric potentials; and
   a plurality of channel circuits, wherein each of the channel circuits corresponds to a corresponding one of the carrier signals, and each of the channel circuits comprises:
      a filter adapted to receive an input signal so as to filter the input signal and to generate a filtered signal based on the second common-mode electric potential;
      a comparison circuit configured to compare the potential of the corresponding one of the carrier signals with the potential of the filtered signal and to generate a pulse-width modulation signal; and
      a driving circuit configured to be turned on or off in response to the pulse-width modulation signal so as to output a load driving signal.

9. The audio signal modulation and amplification circuit according to claim 8, wherein for each of the channel circuits, the difference between the absolute value of the corresponding one of the first common-mode electric potentials and the absolute value of the second common-mode electric potential is less than the difference between the amplitude of the carrier signal and the maximum amplitude of the filtered signal.

10. The audio signal modulation and amplification circuit according to claim 9, wherein one of the first common-mode electric potentials is equal to the second common-mode electric potential.

\* \* \* \* \*